United States Patent
Bald et al.

(10) Patent No.: US 7,026,822 B1
(45) Date of Patent: Apr. 11, 2006

(54) HIGH VOLTAGE SWITCHING MATRIX FOR ELECTRICAL SAFETY COMPLIANCE TEST EQUIPMENT

(75) Inventors: Roger A. Bald, Round Lake Beach, IL (US); Pin-Yi Chen, Taipei (TW)

(73) Assignee: Associated Research, Inc., Lake Forest, IL (US)

( * ) Notice: Subject to any disclaimer, the term of this patent is extended or adjusted under 35 U.S.C. 154(b) by 0 days.

(21) Appl. No.: 11/028,211

(22) Filed: Jan. 4, 2005

(51) Int. Cl.
*G01R 31/02* (2006.01)
(52) U.S. Cl. .................. 324/415; 324/555; 307/134
(58) Field of Classification Search ............... 324/419, 324/511, 551, 415, 555; 307/134
See application file for complete search history.

(56) References Cited

U.S. PATENT DOCUMENTS

| | | | | |
|---|---|---|---|---|
| 4,496,237 | A * | 1/1985 | Schron | 399/81 |
| 5,530,439 | A * | 6/1996 | Steele et al. | 340/7.1 |
| 5,652,526 | A | 7/1997 | Sullivan et al. | 324/772 |
| 6,011,398 | A | 1/2000 | Bald et al. | 324/511 |
| 6,054,865 | A | 4/2000 | Bald et al. | 324/551 |
| 6,515,484 | B1 | 2/2003 | Bald et al. | 324/551 |
| 6,538,420 | B1 | 3/2003 | Bald et al. | 324/114 |
| 6,566,890 | B1 | 5/2003 | Hauptman | 324/601 |
| 6,744,259 | B1 | 6/2004 | Bald | 324/551 |

* cited by examiner

*Primary Examiner*—Walter Benson
(74) *Attorney, Agent, or Firm*—Bacon & Thomas, PLLC

(57) ABSTRACT

A high voltage switching matrix for selectively connecting a plurality of different voltage/current sources or inputs with a plurality of different outputs includes a common or shared relay for each of the voltage/current sources at the voltage/current source inputs rather than at the output ports.

4 Claims, 5 Drawing Sheets

HIGH VOLTAGE SWITCHING MATRIX FOR ELECTRICAL SAFETY COMPLIANCE TEST EQUIPMENT

BACKGROUND OF THE INVENTION

1. Field of the Invention

This invention generally relates to the field of electrical safety compliance testing, and more particularly to a high voltage switching matrix for supplying different test voltages to selected output ports of a multi-function safety compliance test instrument. The selected output ports correspond to different test "channels" and are arranged to scan, or sequentially perform a plurality of safety compliance tests on, multiple devices ("devices under test" or DUTs).

According to the invention, the high voltage switching matrix uses a shared high voltage/continuity input to reduce the number of relays required to switch between the multiple output ports.

2. Description of Related Art

Electrical safety compliance test instruments are used by manufacturers to test electrical products for hazards such as insulation or ground faults that could cause injuries to purchasers and users of the products. Conventional safety compliance tests include continuity, ground bond, AC and DC dielectric withstand or "hipot," insulation resistance, line leakage, and run tests. For convenience, it is common for safety compliance instruments to be capable of performing more than one of these tests.

Descriptions of various types of safety compliance tests and multi-function safety compliance test equipment may be found in commonly-assigned U.S. Pat. Nos. 6,011,398; 6,054,865; 6,515,484; 6,538,420; and 6,744,259, each of which is incorporated by reference herein. Common safety compliance tests, which may be used both to facilitate product design and during manufacture, include line leakage, insulation resistance, and ground bond tests, as well as various types of dielectric withstand tests. The detailed descriptions in the above-cited patents illustrate the diversity of safety compliance tests that currently must be performed in various situations. For example, line leakage safety compliance testing is primarily used during development of a product to verify whether a design is safe by simulating possible problems which could occur if the product is faulted or misused while the product is operating under high line conditions (110% of the highest input voltage rating of the product), and measuring the amount of current to which a user of an electrical device is exposed. On the other hand, insulation resistance tests are used during design of a product to measure circuit-to-ground impedance by measuring leakage current when a non-destructive voltage (in general, lower than 1000 volts) is applied between the circuit and ground, while dielectric withstand or "hipot" safety compliance tests may be required either during design or manufacturing to measure insulation integrity by subjecting a device to voltages substantially greater than those applied during normal operation (in general, twice the normal operating voltage, plus 1000 volts), and measuring all stray current. Finally, ground bond tests are used during design or manufacturing to measure the response of the ground circuit to potential fault currents that might result from defective insulation, while continuity tests are used to detect short circuits and verify the electrical integrity of a product after assembly.

In order to facilitate testing of large numbers of products, many multifunction safety test instruments are equipped with scanners, which provide test currents and voltages to multiple output ports so that the same tests can sequentially run on more than one product in a single test run. The scanner includes a switching matrix capable of switching between high and low voltages as required for different tests, and for supplying the high and low voltages to each of the output ports. FIG. 1 shows a "scanner matrix board" 69 used in the multifunction tester of U.S. Pat. No. 6,054,865. The scanner provides eight high voltage ports and eight low voltage ports corresponding to output channels CH1 to CH8. Each "channel" is capable of being set to a high or low level. The various connection between the scanner ports or jacks are accomplished by a plurality of relays RY1–RY8 for switching the low voltage input 1300 from an amplifier board between current output jacks 37–44, relays RY19–RY26 for switching the high voltage input from high voltage control board 68 between high voltage scanner high voltage jacks 28–36, and relays RY10–RY17 for selectively connecting output jacks 29–36 to return jack 28 when relay RY18 is closed. In addition, relay RY9 ties the return jack 28 to the ground/common jack 55 when closed.

Not counting relays RY9 and RY18 which switch between different return/ground configurations, this switching arrangement requires 24 relays RY1–RY8, RY10–RY17, and RY19–RY26, one relay at each output jack for connection to the high voltage input 1200, one for the low voltage input 1300, and one for connection to the return 28. All of these relays are required to carry high voltages and/or currents, and therefore are relatively expensive. In general, a conventional switching matrix with m different voltages to be switched between n output ports requires at least m×n relays, and thus the cost increases rapidly for each added voltage or output port.

In addition to the commonly assigned patents cited above, which disclose multi-function test instruments with scanners, or that can be connected to scanners, the following patents may be of background interest: U.S. Pat. Nos. 5,652,526 and 6,538,420 disclose conventional high/low voltage switching arrangements, but the matrices lack multiple channel outputs, while U.S. Pat. No. 6,566,890 discloses a switching matrix for multiple channels that lacks high and low voltage inputs.

SUMMARY OF THE INVENTION

It is a first objective of the invention to provide a multiple channel, multiple function safety compliance test instrument having a reduced number of relays, and therefore a reduced cost.

It is a second objective of the invention to provide a high voltage switching matrix capable of scanning or connecting at least two different voltage and/or current sources to a plurality of different output ports, in which a number of relays is reduced.

It is a third objective of the invention to provide a high voltage switching matrix suitable for use in multiple function safety compliance equipment capable of switching between high and low voltage tests over multiple output channels, and which does not require high and low voltage relays for each channel.

These objectives are accomplished, in accordance with the principles of the invention, by providing a high voltage switching matrix for selectively connecting a plurality m of different voltage/current sources or inputs with a plurality n of different outputs, and in which a common or shared relay is provided for each of the m voltage/current sources at the voltage/current source inputs rather than at the output ports, thereby reducing the number of relays required to switch between the m voltage/current sources and n outputs. For example, the number of relays required by a 3×8 switching matrix (including a low voltage input, a high voltage input, and a return) is conventionally at least 24. According to the present invention, the number is reduced to 18. More generally, the number N of relays required by an m×n matrix is reduced from $N=(m \times n)$ to $N=(m-1)+2n$.

It will be appreciated by those skilled in the art that the present invention can be applied to any safety compliance instrument that includes a switching matrix having m input connections and n output connections, so long as tests requiring different inputs are to be carried out sequentially rather than at the same time, since only one input can be active during any given test. In addition, it will be appreciated that each of the switched inputs may be capable of being set to different output voltages, currents, and/or waveforms, and that the switching is generally between high and low voltage sources rather than between specific voltages. In general, while the invention is specifically adapted for use in safety compliance test equipment, it is not intended to be limited to any specific type of safety compliance test instrument, but rather is intended to apply to any multiple channel scanner and to any electrical tests that might be used during design, manufacture, and final inspection of a product.

DETAILED DESCRIPTION OF THE PREFERRED EMBODIMENTS

Figure 1:
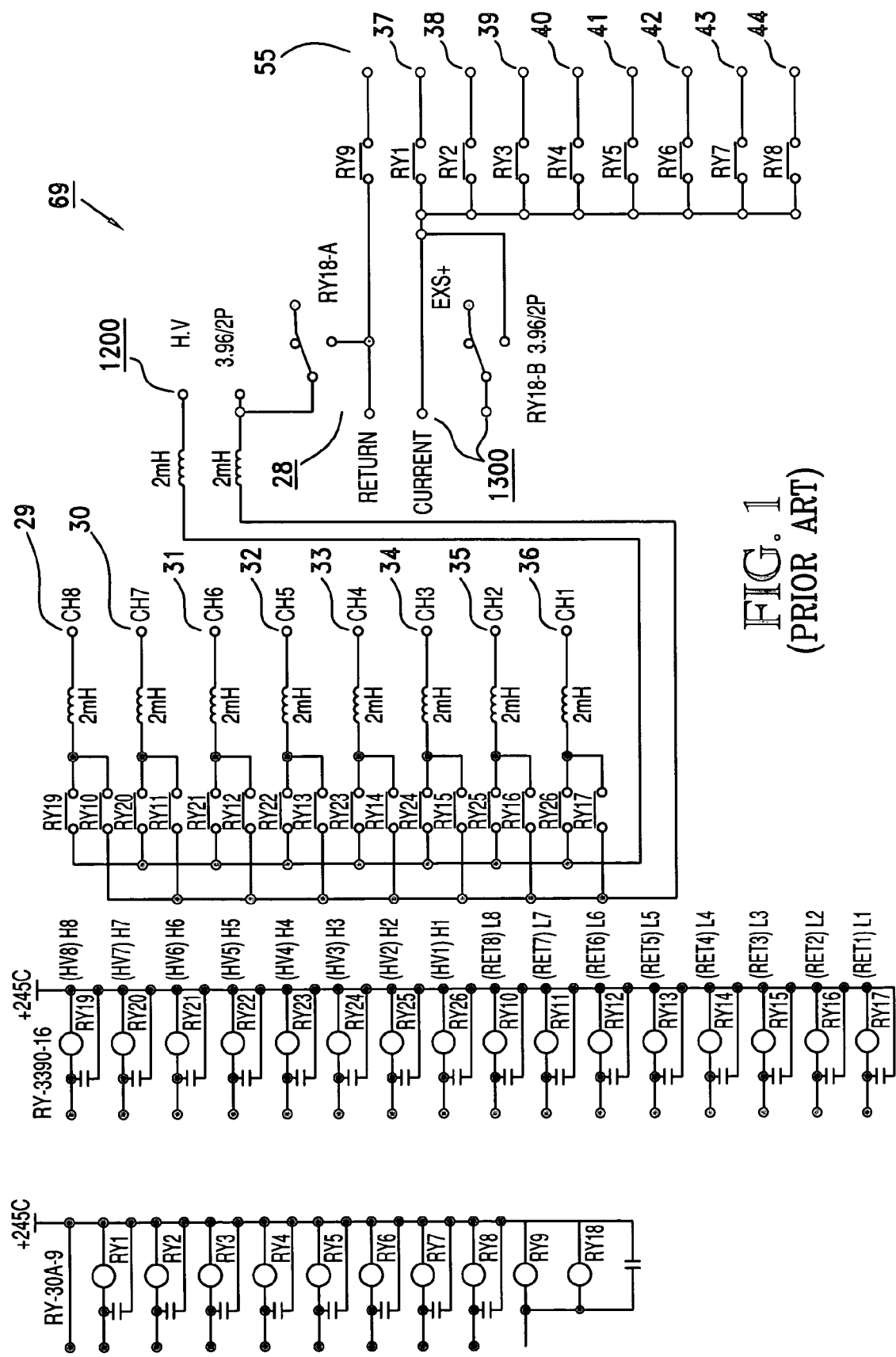
FIG. 1 is a schematic circuit diagram of a conventional eight channel scanner matrix board having high voltage and low voltage inputs, and a common return.

In order to illustrate the principles of the invention, a 3×3 switching matrix will first be described in connection with FIG. 2. Then, a 3×8 switching matrix corresponding to the three input, eight channel switching matrix illustrated in FIG. 1 will be described. It should be appreciated, however, that the principles of the invention are applicable to any combination of three or more inputs and three or more outputs.

Figure 2:
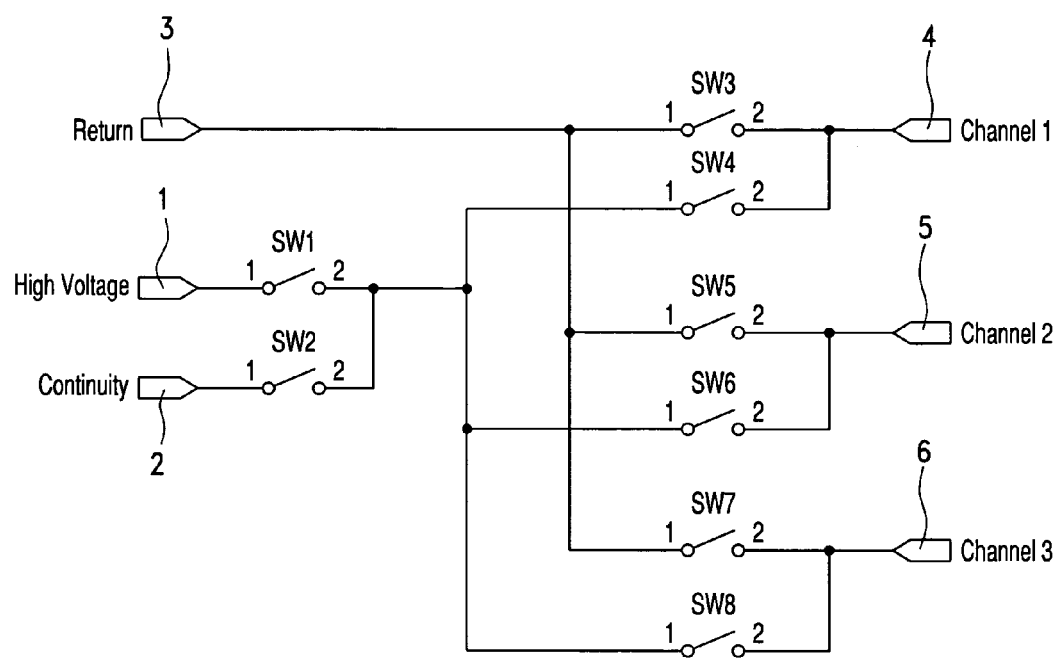
FIG. 2 is a schematic diagram showing, for illustrative purposes, a relay configuration for a 3×3 high voltage switching matrix.

As illustrated in FIG. 2, the switching matrix of the invention includes a high voltage input terminal 1 for supplying high voltages, generally in excess of 500 volts, for carrying out dielectric withstand or "hipot" tests, and a low voltage input terminal 2 for carrying out continuity, insulation resistance, and other relatively low voltage safety tests. In addition, the switching matrix of FIG. 2 includes a return 3 for completing the respective high and low voltage circuits.

The high and low voltage terminals may be connected to voltage or current sources and corresponding test circuits of the type described in U.S. Pat. Nos. 6,011,398; 6,054,865; 6,515,484; 6,538,420; and 6,744,259, cited above, voltage/current sources and test circuits of the type used in Associated Research, Inc.'s Quadchek™ or Omnia™ test instruments, or any other safety compliance instrument capable of performing different types of safety compliance tests via multiple output ports.

In addition to high voltage, low voltage, and return input terminals 1–3, the 3×3 switching matrix illustrated in FIG. 2 also includes three output terminals 4–6 arranged to be connected to at least three output ports, and eight relays SW1–SW8 for selectively connecting one of the two input terminals 1,2 to one of the three output terminals 4–6.

As in the conventional multiple output port instrument, each output port must be switched to permit scanning, and switches must be provided to permit switching between the two different power supply voltages so as to perform different types of tests. Typically, this has been accomplished by providing three switches for each output, as described above. However, in the preferred embodiment of the invention, each output includes a single power supply switch SW4, SW6, and SW8 and a single return switch SW3, SW5, and SW7, and shared switches SW1 and SW2 are provided for each of the inputs. For the 3×3 example, the number of required relays is reduced from nine to eight.

Those skilled in the art will appreciate that although the switches SW1 to SW8 of FIG. 2 are generally in the form of relays, the invention in its broadest form is intended to encompass other types of high voltage switches, including solid state switches.

Figure 3:
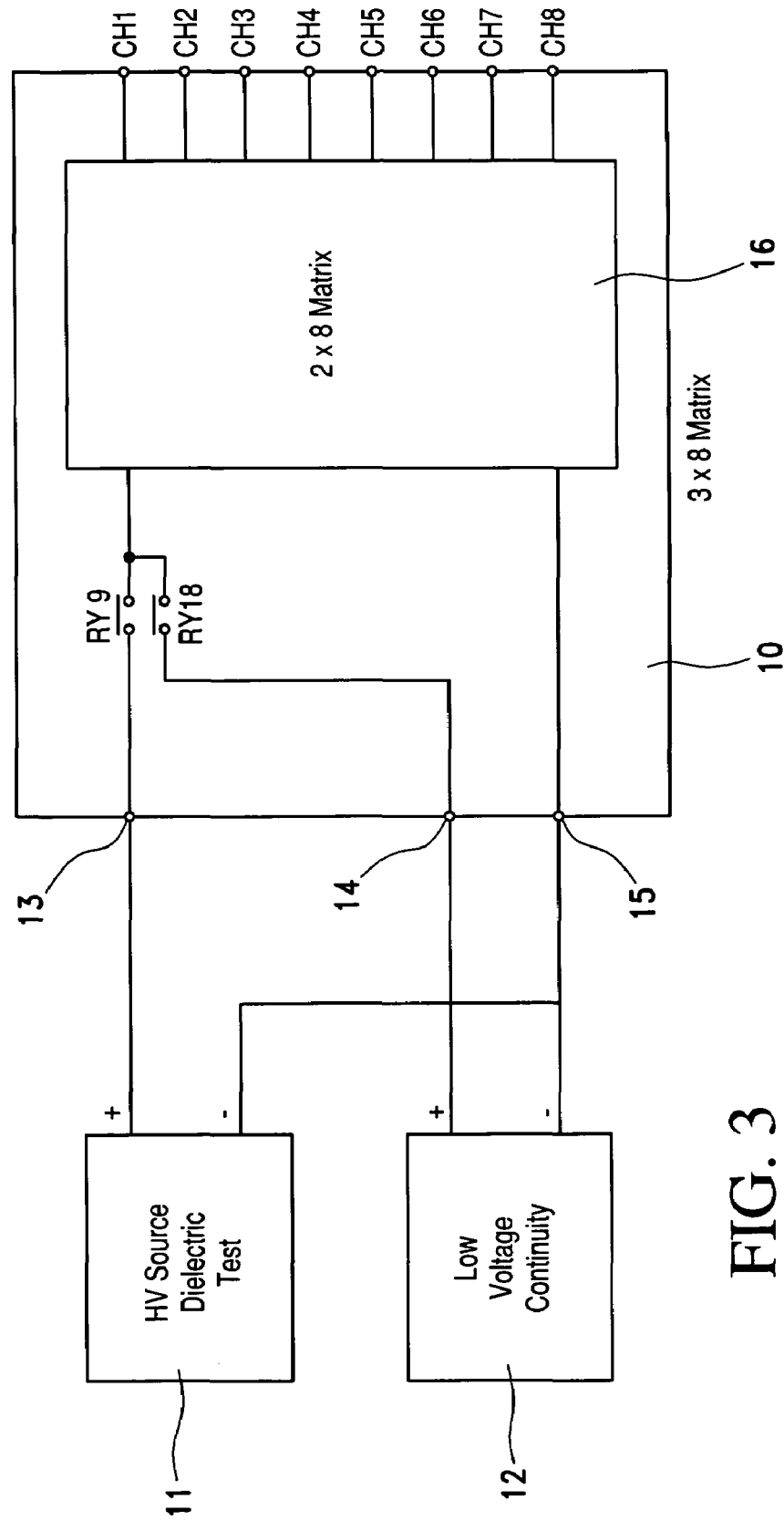
FIG. 3 is a block diagram of a safety compliance instrument that includes a 3×8 scanner matrix board constructed in accordance with the principles of a preferred embodiment the invention.

FIG. 3 shows a practical 3×8 implementation of the switching arrangement illustrated in FIG. 2, suitable for use in a safety compliance tester. The safety compliance tester includes a switching matrix board 10, a high voltage source 11 for supplying power for dielectric withstand or other high voltage safety tests, and a low voltage source 12 for continuity or other low voltage safety tests. High voltage source 11 is connected to a high voltage terminal 13 of the switching matrix board 10 while low voltage source 12 is connected to low voltage terminal 14. In addition, both sources are connected to a common return terminal 15. Common return terminal 15 may be connected to the respective voltage sources 11 and 12 via switches or relays (not shown) as in the conventional arrangement of FIG. 1, although such switching is not absolutely necessary.

According to the preferred embodiment of the invention, a pair of switches RY9 and RY18 corresponding to switches SW1 and SW2 of FIG. 2 are provided between the high and low voltage terminals 13,14 and what is effectively a 2×8 matrix 16 for switching the input voltage between the 8 output ports CH1–CH8.

Figure 4:
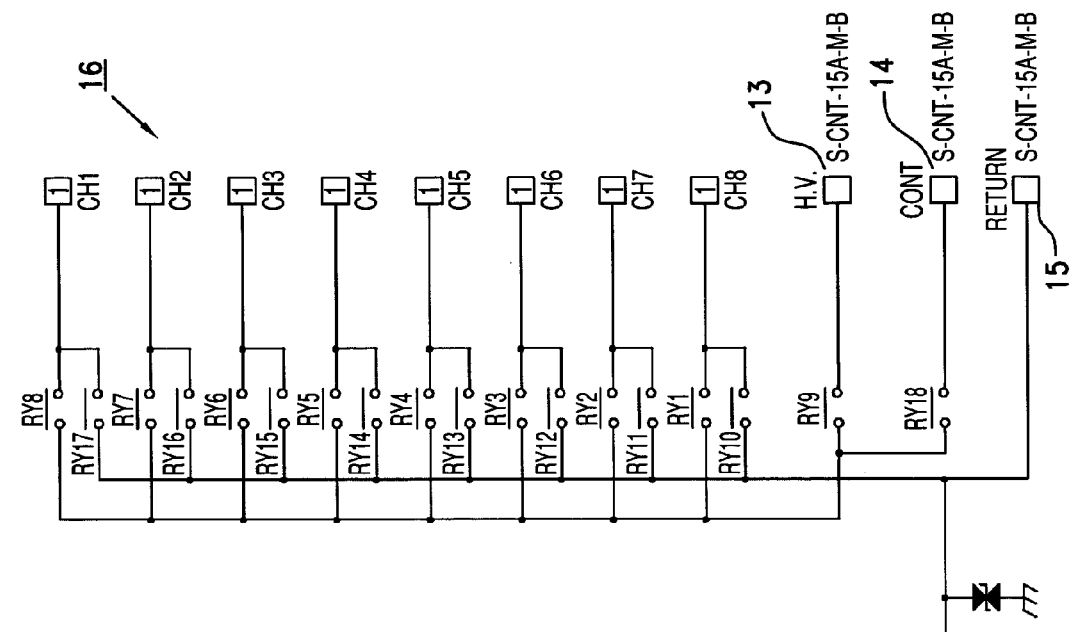
FIG. 4 is a schematic circuit diagram of a 3×8 matrix board suitable for use in the safety compliance instrument of the FIG. 3.
Figure 4:
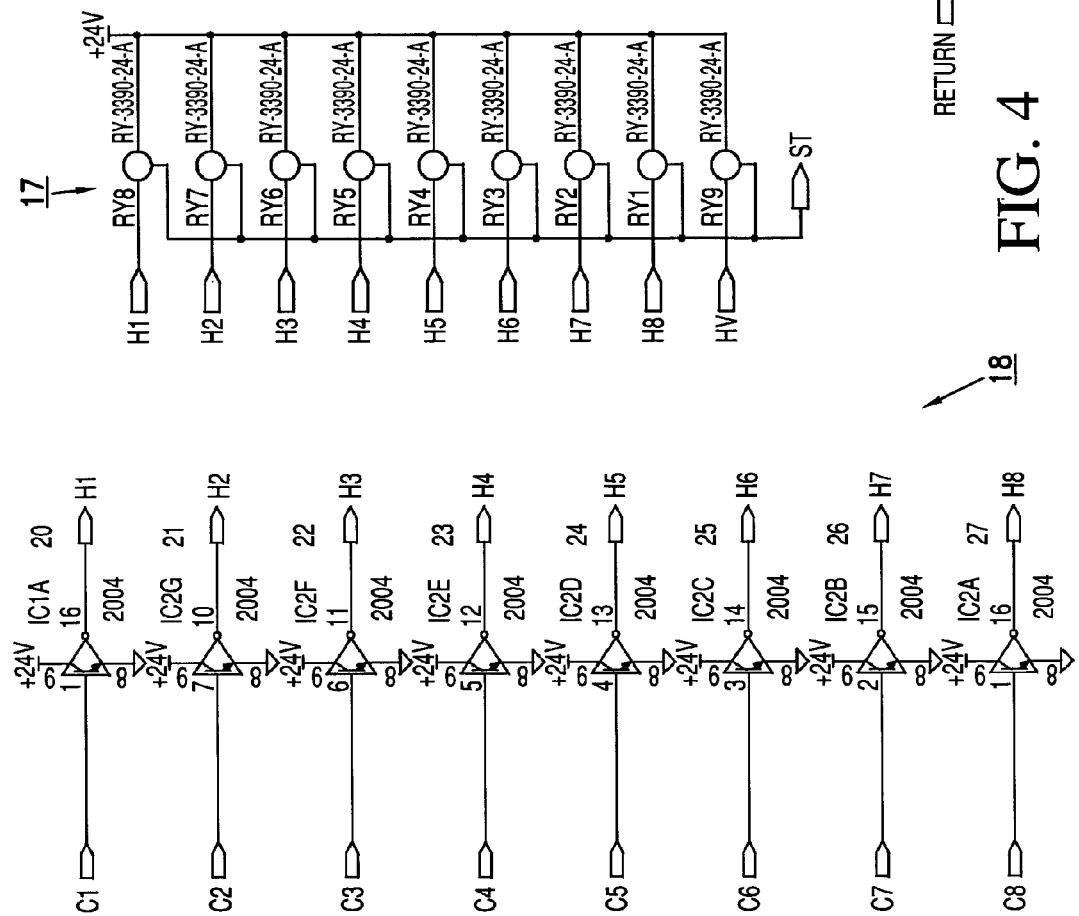

The "2×8 matrix" which forms the output switching portion of the "3×8 matrix" is illustrated in detail in FIG. 4. It includes eight paired input/return relay pairs RY1,RY10, RY2,RY11, . . . RY8,RY17 arranged to be switched on and off in pairs, so that when one of the relay pairs is closed, whichever of the two input relays RY9 and RY18 is closed supplies a corresponding voltage to the output port connected to the closed relays.

Figure 5:
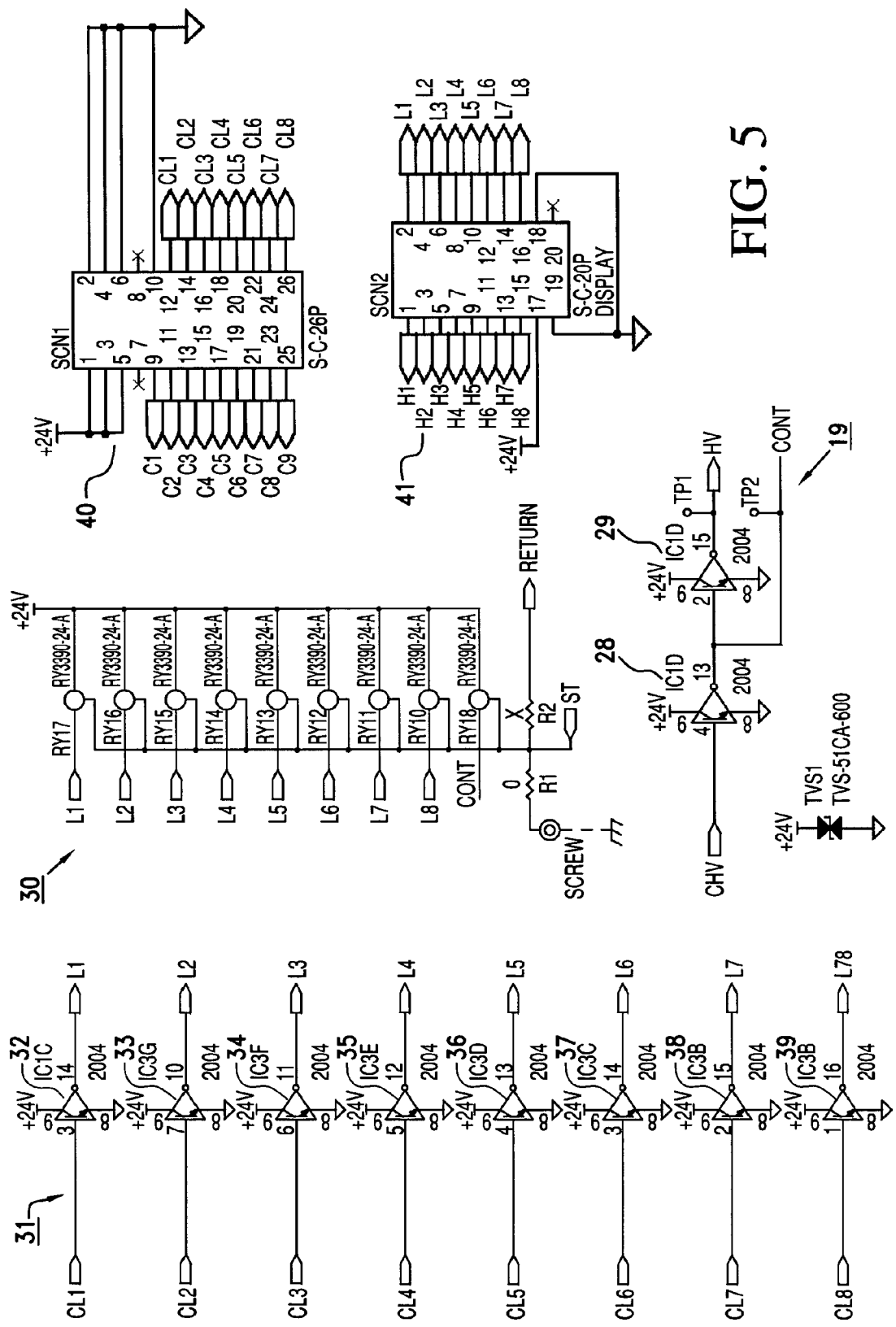
FIG. 5 is a schematic circuit diagram of control circuitry for the 3×8 matrix board of FIG. 4.

As shown in FIG. 4, the respectively relays RY1–RY8 are actuated by signals supplied through terminals H1–H8 of relay actuation circuit 17, and by terminals C1–C8 and amplifiers 20–27 of inverter circuit 18. The return relays are controlled by inputs L1–L8 as illustrated in FIG. 5. Relay RY9 is activated by a signal input through terminal HV of activation circuit 17 shown in FIG. 4, and terminal CHV and amplifiers 28,29 of high/low voltage control signal input circuit 19 shown in FIG. 5.

Similarly, as shown in FIG. 5, the respective return relays RY10–RY17 are actuated by signals supplied through terminals L1–L8 of return relay actuation circuit 30, terminals CL1–CL8 of inverter circuit 31, and amplifiers 32–39 of inverter circuit 31. Relay RY18 is activated by a low voltage signal CONT supplied by amplifier 28 of high/low voltage control signal input circuit 19.

Control signals for the respective control circuits 17, 18, 30, and 31 are supplied by the microprocessor from a main control board (not shown) through connectors 40 and 41. In the illustrated embodiment, the low and high voltage signals are supplied through the same input, with the high voltage control signals being inverted relative to the low voltage control signals, although those skilled in the art that separate input circuits may be used to control respective relays RY9 and RY18. In fact, it is intended that the invention not be limited to a particular switch activation control circuit, but rather to encompass any circuitry capable of controlling a switching matrix so as to switch between high and low voltage/currents and multiple output ports.

Having thus described a preferred embodiment of the invention in sufficient detail to enable those skilled in the art to make and use the invention, it will nevertheless be appreciated that numerous variations and modifications of the illustrated embodiment may be made without departing from the spirit of the invention, and it is intended that the invention not be limited by the above description or accompanying drawings, but that it be defined solely in accordance with the appended claims.

We claim:

1. A high voltage switching matrix, comprising:
   a plurality m of voltage/current inputs including at least one high voltage input, at least one low voltage input, and a return;
   respective high and low voltage input switches for each high voltage input and each low voltage input;
   a plurality n of output ports; and
   a single output port input switch and a single output port return switch for each output port,
   wherein said high and low voltage input switches are connected to each of said output port input switches,
   wherein said at least one high voltage input is connected to a respective said output port by at least said high voltage input switch and one of said output port input switches;
   wherein said at least one low voltage input is connected to a respective said output port by at least said low voltage input switch and one of said output port input switches; and
   wherein said return is connected to a respective said output port by said output port return switch, and
   wherein said output port return switches are directly connected to the return to thereby reduce a total required number N of said switches from N=m×n to N=(m−1)+2n.

2. A high voltage switching matrix as claimed in claim 1, wherein said high and low voltage input switches, said output port input switches, and said output port return switches are relays.

3. A high voltage switching matrix as claimed in claim 1, wherein said high voltage switching matrix forms a scanner matrix of an electrical safety compliance test instrument.

4. A high voltage switching matrix as claimed in claim 1, wherein said plurality of voltage/current inputs includes one high voltage input, one low voltage input, and said return, and wherein a number of said output ports is eight to form a 3×8 scanning matrix.

* * * * *